(12) United States Patent
Huang et al.

(10) Patent No.: US 9,396,767 B1
(45) Date of Patent: Jul. 19, 2016

(54) VOLTAGE DIVISION CIRCUIT, CIRCUIT FOR CONTROLLING OPERATION VOLTAGE AND STORAGE DEVICE

(71) Applicant: Shanghai Huahong Grace Semiconductor Manufacturing Corporation, Shanghai (CN)

(72) Inventors: Mingyong Huang, Shanghai (CN); Jun Xiao, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 14/979,008

(22) Filed: Dec. 22, 2015

(30) Foreign Application Priority Data

Dec. 30, 2014 (CN) .......................... 2014 1 0857348

(51) Int. Cl.
  *G11C 5/14* (2006.01)
  *G11C 16/30* (2006.01)
  *H02M 3/07* (2006.01)
  *H02M 3/158* (2006.01)

(52) U.S. Cl.
  CPC ................ *G11C 5/145* (2013.01); *G11C 16/30* (2013.01); *H02M 3/07* (2013.01); *H02M 3/158* (2013.01)

(58) Field of Classification Search
  CPC .......... G11C 5/145; G11C 16/30; H02M 3/07; H02M 3/158
  See application file for complete search history.

(56) References Cited

U.S. PATENT DOCUMENTS

| 6,359,814 B1 * | 3/2002 | Sundaram | G11C 11/22 327/535 |
| 7,330,049 B2 * | 2/2008 | Perisetty | H01L 27/0921 257/E27.063 |
| 7,616,048 B2 * | 11/2009 | Choi | G05F 3/205 327/534 |
| 9,117,420 B2 * | 8/2015 | Fujisawa | G09G 3/20 |
| 2015/0029806 A1 * | 1/2015 | Qiao | G11C 5/147 365/226 |

* cited by examiner

*Primary Examiner* — Harry W Byrne
*Assistant Examiner* — R Lance Reidlinger
(74) *Attorney, Agent, or Firm* — Harness, Dickey & Pierce, P.L.C.

(57) ABSTRACT

A voltage division circuit, a circuit for controlling operation voltage and a storage device are provided. The voltage division circuit includes: a receiving transistor; a transistor group including m transistors connected in series; n type-one switches, each of which includes three terminals, the first is connected with a drain of a former one and a source of a latter one of two adjacent transistors in the transistor group, the second is connected with ground, the third is adapted for receiving a timing control signal; and n+1 type-two switches, each of which includes three terminals, the first is connected with a source of a transistor in the transistor group, the second is adapted for outputting a divided voltage, and the third is adapted for receiving the timing control signal. The voltage division circuit can save chip area, and work properly under a condition that the voltage to be divided is low.

15 Claims, 5 Drawing Sheets

VOLTAGE DIVISION CIRCUIT, CIRCUIT FOR CONTROLLING OPERATION VOLTAGE AND STORAGE DEVICE

CROSS-REFERENCE TO RELATED APPLICATIONS

The present application claims priority to Chinese patent application No. 201410857348.2, filed on Dec. 30, 2014, and entitled "VOLTAGE DIVISION CIRCUIT, CIRCUIT FOR CONTROLLING OPERATION VOLTAGE AND STORAGE DEVICE", the entire disclosure of which is incorporated herein by reference.

TECHNICAL FIELD

The present disclosure generally relates to semiconductor technology, and more particularly, to a voltage division circuit, a circuit for controlling operation voltage, and a storage device.

BACKGROUND

Nowadays, in the rapid development of semiconductor storage device, DRAM, EEPROM, FLASH and other advanced storage devices have been widely used in computers and mobile communication terminals, attributed to their advantages such as high density, low power consumption and low price.

Due to the requirements of low power consumption and low cost, a power supply of the storage device always has a low voltage, such as 2.5V, 1.8V, etc. However, in order to implement "write", "erase" and other operations of information, a programming voltage and an erase voltage which are much higher than the power supply voltage are always required, such as 8V, 12V, etc. Therefore, a charge pump circuit is widely used in the storage device. The charge pump circuit is used to obtain higher operation voltages for the storage device from the lower power supply voltage, such as the programming voltage, the erase voltage, etc.

A voltage division circuit is always used in a charge pump circuit, and is adapted for dividing a signal to be divided. A voltage division coefficient of the voltage division circuit stands for a ratio between a voltage value of the signal to be divided and a voltage value of the divided signal. In the voltage division circuit, multiple voltage division coefficients may be obtained by disposing the output terminal at different positions.

Figure 1:
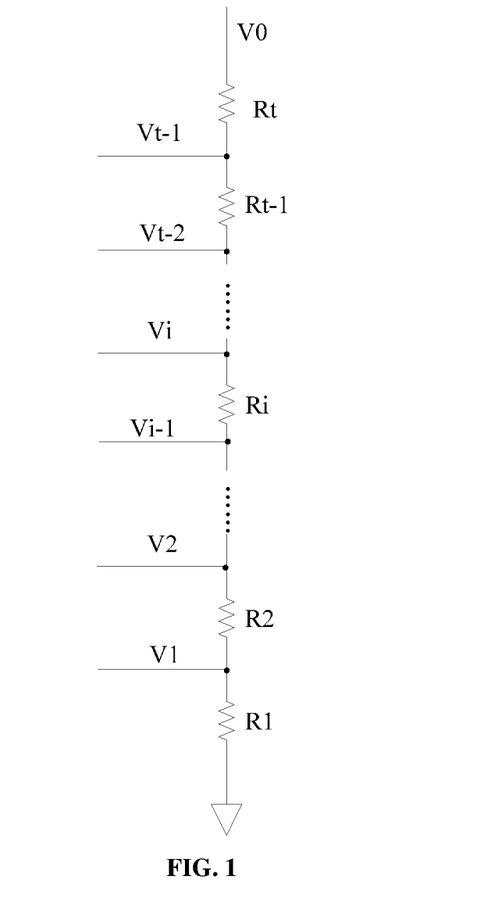
FIG. 1 schematically illustrates a structure diagram of a conventional resistor-type voltage division circuit.

A structure diagram of a conventional resistor-type voltage division circuit is illustrated in FIG. 1. The circuit includes t resistors: R1 . . . Rt, which are connected in series, where an output terminal of a former one of every two adjacent resistors is connected with an input terminal of a latter one, an output terminal of a first resistor R1 is connected with ground, and an input terminal of the $t^{th}$ resistor Rt is adapted for receiving a signal to be divided V0. The voltage division circuit includes t−1 output terminals, such that it has t−1 voltage division coefficients and can output t−1 divided voltages V1 . . . Vt−1, where the $i^{th}$ divided voltage is equal to (i/t)V0. Different divided voltages at different voltage division coefficients can be obtained by connecting different output terminals.

However, in order to achieve a low current consumption, the above resistor-type voltage division circuit needs high resistors. The large resistors cost a large chip area and are harmful to miniaturization of the circuit.

Figure 2:
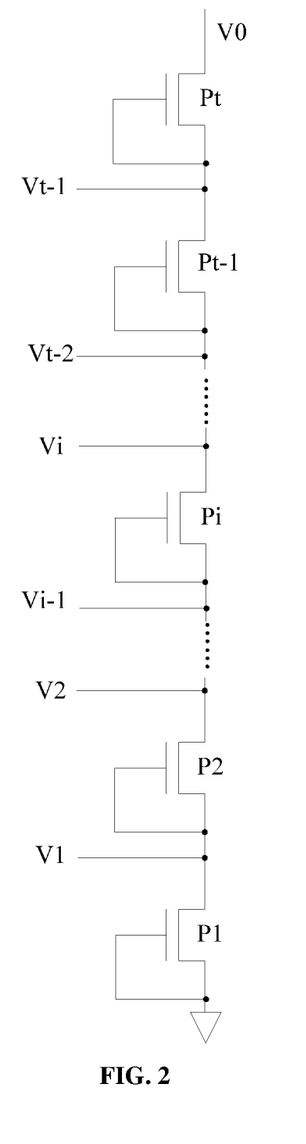
FIG. 2 schematically illustrates a structure diagram of a conventional transistor-type voltage division circuit.

A structure diagram of a conventional transistor-type voltage division circuit is illustrated in FIG. 2. The circuit includes t PMOS transistors R1 . . . Rt, which are connected in series, where a drain and a gate of a former one of every two adjacent PMOS transistors is connected with a source of a latter one, a source of the $t^{th}$ PMOS transistor Pt is adapted for receiving a signal to be divided V0, and a drain and a gate of a first PMOS transistor P1 is connected with ground. The voltage division circuit includes t−1 output terminals, such that it has t−1 voltage division coefficients and can output t−1 divided voltages V1 . . . Vt−1, where the $i^{th}$ divided voltage is equal to (i/t)V0. Different divided voltages at different voltage division coefficients can be obtained by connecting different output terminals.

However, in the above transistor-type voltage division circuit, if the value of the signal to be divided V0 is smaller than a sum of threshold values of the t transistors (about 0.7tV), the voltage division circuit cannot be turned on. Thus, all the PMOS transistors are in an off state, and all voltage division points are in a floating state. That is, the voltage division circuit cannot work properly.

SUMMARY

In order to solve the above problem, a voltage division circuit, a circuit for controlling operation voltage and a storage device are provided in embodiments of the present disclosure. The circuits of the present disclosure not only can save chip area, but also can work properly under a condition that the voltage to be divided is low.

In order to solve the above problem, a circuit for controlling operation voltage is provided in embodiments of the present disclosure. In one embodiment, the circuit may include:

a voltage boost circuit adapted for: if receiving a first signal, performing a voltage boost process so as to output a boosted voltage; and if receiving a second signal, stopping the voltage boost process and maintaining a value of the boosted voltage;

a voltage division circuit adapted for performing a voltage division process on the boosted voltage so as to output a divided voltage, wherein the voltage division circuit comprises a plurality of different voltage division coefficients, and wherein the voltage division circuit comprises: a receiving transistor, where a source of the receiving transistor is adapted for receiving the boosted voltage; a transistor group comprising m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground; n type-one switches, each of which comprises a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or to be turned off, and n≤m−1; and n+1 type-two switches, each of which comprises a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting the divided voltage, and the third terminal is adapted for receiving the timing control signal so as to control the type-two switch to be turned on or to be turned off;

a comparator adapted for: comparing the divided voltage with a reference voltage; if the divided voltage is lower than the reference voltage, outputting the first signal; and if the divided voltage is higher than the reference voltage, outputting the second signal;

a control circuit adapted for generating a timing control signal, so as to perform a descending switching operation on at least parts of the plurality of voltage division coefficients until the boosted voltage reaches a target voltage; and an output circuit adapted for outputting the boosted voltage.

In some embodiments, the transistors of the transistor group may be PMOS transistors.

In some embodiments, the type-one switches may be NMOS transistors; and for each of type-one switches, the first terminal is a source, the second terminal is a drain and the third terminal is a gate; the type-two switches may be NMOS transistors; and for each of the type-two switches, the first terminal is a source, the second terminal is a drain and the third terminal is a gate.

In some embodiments, the control circuit may include n+1 timing pulse generation units, where each of n former ones of the n+1 timing pulse generation units is connected with one type-one switch and one type-two switch, and is adapted for generating a timing pulse signal to control the type-one switch and the type-two switch to be turned on or off; and the last one of the n+1 timing pulse generation units is connected with one type-two switch, and is adapted for generating a timing pulse signal to control the type-two switch to be turned on or off.

In some embodiments, the timing pulse generation unit may include a decoding circuit and a NOR gate, the decoding circuit is connected with a first input terminal of the NOR gate, a second input terminal of the NOR gate is adapted for receiving a low level signal, and an output terminal of the NOR gate is connected with the type-one switch and the type-two switch.

In some embodiments, the first signal may be a high level signal, and the second signal may be a low level signal.

In order to solve the above problem, a storage device is also provided in embodiments of the present disclosure. The storage device may include the circuit for controlling operation voltage which is described above.

In order to solve the above problem, a voltage division circuit is also provided in embodiments of the present disclosure. In one embodiment, the circuit may include:

a receiving transistor, where a source of the receiving transistor is adapted for receiving a voltage to be divided;

a transistor group comprising m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground;

n type-one switches, each of which comprises a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or off, and n≤m−1; and n+1 type-two switches, each of which comprises a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting a divided voltage, and the third terminal is adapted for receiving the timing control signal so as to control the type-two switch to be turned on or off.

In some embodiments, the transistors of the transistor group may be PMOS transistors.

In some embodiments, the type-one switches may be NMOS transistors; and for each of type-one switches, the first terminal is a source, the second terminal is a drain and the third terminal is a gate; the type-two switches may be NMOS transistors; and for each of the type-two switches, the first terminal is a source, the second terminal is a drain and the third terminal is a gate.

Compared with the conventional technology, embodiments of the present disclosure have following advantages. In the voltage division circuit provided in embodiments of the present disclosure, transistors are employed to divide a voltage, such that the chip area is saved. On the basis that a plurality of transistors are connected in series, a plurality of type-one switches and a plurality of type-two switches are added, such that when any set of the type-one switch and the type-two switch is turned on, parts of the transistors connected in series don't work. Hence, a requirement on the voltage value of the signal to be divided is reduced, and a situation that the voltage division circuit cannot work properly is avoided.

DETAILED DESCRIPTION

As described above, the conventional voltage division circuit mostly has a plurality of resistors connected in series or a plurality of transistors connected in series so as to obtain a plurality of voltage division coefficients. However, the transistor-type voltage division circuit costs a large chip area; and the transistor-type voltage division circuit has a high requirement on the voltage value of the signal to be divided, and probably work improperly.

In order to solve the above problems, a voltage division circuit, a circuit for controlling operation voltage and a storage device are provided. Embodiments of the present disclosure employ transistors to divide a voltage, such that the chip area is saved. On the basis that a plurality of transistors are connected in series, a plurality of type-one switches and a plurality of type-two switches are added, such that when any set of the type-one switch and the type-two switch is turned on, parts of the transistors connected in series don't work.

Hence, a requirement on the voltage value of the signal to be divided is reduced, and a non-working situation of the voltage division circuit is avoided.

In order to clarify the objects, characteristics and advantages of the disclosure, the embodiments of the present disclosure will be described in detail in conjunction with the accompanying drawings.

Figure 3:
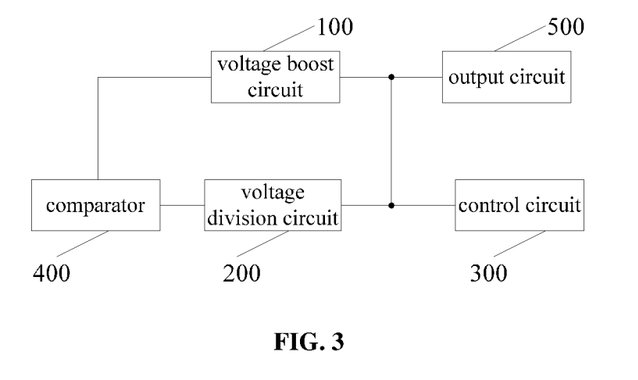
FIG. 3 schematically illustrates a block diagram of a circuit for controlling operation voltage according to one embodiment of the present disclosure.

Referring to FIG. 3, a circuit for controlling operation voltage is provided in embodiments of the present disclosure. The circuit may include:

a voltage boost circuit 100 adapted for: if receiving a first signal, performing a voltage boost process so as to output a boosted voltage; and if receiving a second signal, stopping the voltage boost process and maintaining a value of the boosted voltage;

a voltage division circuit 200 adapted for performing a voltage division process on the boosted voltage so as to output a divided voltage, wherein the voltage division circuit includes a plurality of output terminals, and the plurality of output terminals corresponds to a plurality of different voltage division coefficients, respectively;

a control circuit 300 adapted for generating a timing control signal, so as to perform a descending switching operation on at least parts of the plurality of voltage division coefficients until the boosted voltage reaches a target voltage;

a comparator 400 adapted for: comparing the divided voltage with a reference voltage; if the divided voltage is lower than the reference voltage, outputting the first signal; and if the divided voltage is higher than the reference voltage, outputting the second signal; and an output circuit 500 adapted for outputting the boosted voltage.

In this embodiment, the voltage boost circuit 100 may be a charge pump of any type, which can perform a voltage boost process on an initial voltage (for example, a power supply voltage) and output a boosted voltage.

The output circuit 500 is connected with an output terminal of the voltage boost circuit 100 and is adapted for outputting the boosted voltage.

The voltage division circuit 200 is connected with an output terminal of the voltage boost circuit 100, and is adapted for performing a voltage division process on the received boosted voltage, so as to output a divided voltage. That is, $V2=aV1$, wherein V2 stands for the divided voltage, V1 stands for the boosted voltage, and a stands for a voltage division coefficient (namely, a ratio of the divided voltage V2 and the boosted voltage V1).

In this embodiment, the voltage division circuit 200 adopts a transistor division manner and includes n+1 output terminals. Each of the n+1 output terminals corresponds to a different voltage division coefficient, such that a plurality of different voltage division processes can be performed on the boosted voltage. For example, the voltage division coefficient may be 1/2, 1/3, 1/4, 1/5, 1/6 . . . 1/n, etc, so as to output different divided voltages.

A number of the plurality of voltage division coefficients is an integer greater or equal to 2, and determines how many steps a voltage boost process is divided into subsequently. The larger the number is, the more effective the boost speed of the boosted voltage is controlled.

Specifically, the voltage division circuit 200 may include:

a receiving transistor, where a source of the receiving transistor is adapted for receiving a voltage to be divided (that is, the boosted voltage);

a transistor group including m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground;

n type-one switches, each of which includes a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or off, and $n \leq m-1$; and n+1 type-two switches, each of which includes a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting a divided voltage, and the third terminal is adapted for receiving the timing control signal so as to control the type-two switch to be turned on or off, wherein the type-one switches are NMOS transistors; and for each of type-one switches, the first terminal is a source, the second terminal is a drain and the third terminal is a gate;

wherein the type-two switches are NMOS transistors; and for each of the type-two switches, the first terminal is a source, the second terminal is a drain and the third terminal is a gate; and wherein the transistors of the transistor group are PMOS transistors.

Specifically, if the timing control signal received by the third terminal of the type-one switch and the third terminal of the type-two switch is a high level signal, both the type-one switch and the type-two switch are turned on, such that the voltage division circuit output a voltage of a source of the transistor which is connected with the first terminal of the type-one switch.

It should be noted that, in other embodiments of the present disclosure, the switch may be other kinds of components.

The control circuit 300 may include n+1 timing pulse generation units, where each of n former ones of the n+1 timing pulse generation units is connected with one type-one switch and one type-two switch, and is adapted for generating a timing pulse signal to control the type-one switch and the type-two switch to be turned on or off; and the last one of the n+1 timing pulse generation units is connected with one type-two switch, and is adapted for generating a timing pulse signal to control the type-two switch to be turned on or off. Thus, the switching control of the plurality of voltage division coefficient can be achieved, and then the boosted voltage can be controlled to be equal to the target voltage.

A value of the target voltage is equal to a value of a required voltage (for example, an erase voltage).

The timing pulse generation unit may include: a decoding circuit and a NOR gate, where the decoding circuit is connected with a first input terminal of the NOR gate, a second input terminal of the NOR gate is adapted for receiving a low level signal, and an output terminal of the NOR gate is connected with the gate of the NMOS transistor.

Specifically, the decoding circuit may include a clock circuit and a frequency division circuit. The specific implementation of the decoding circuit is well known to those skilled in the art, and is not described in detail herein.

In this embodiment, different clock circuits and frequency division circuits can be used to output timing pulse signals of different waveforms, so as to control parameters of the boost voltage, such as a rising rate, a rising time, etc.

The comparator 400 may include: a first input terminal, a second input terminal and an output terminal, where the first terminal is adapted for receiving a reference voltage, the second input terminal is connected with the output terminal of the control circuit, and the output terminal is connected with the input terminal of the voltage boost circuit 100.

In this embodiment, for the comparator 400, when a voltage of the second input terminal is greater than a voltage of the first input terminal, the output terminal outputs a high level signal to the voltage boost circuit, such that the comparator 400 performs the voltage boost process (namely, the first signal is a high level signal); when the voltage of the second input terminal is less than the voltage of the first input terminal, the output terminal outputs a low level signal to the voltage boost circuit, such that the voltage boost circuit stops the voltage boost process (namely, the second signal is a low level signal).

It should be noted that, in other embodiments, the first signal may be a low level signal and the second signal may be a high level signal.

The reference voltage may has a value lower than a value of a system voltage (for example, 1.5V), such as 0.9V, 1V, 1.2V, etc. The reference voltage may be generated by a reference voltage generation circuit (not shown). The lower the value of the reference voltage is, the more accurate the control of the operation voltage is.

Figure 4:
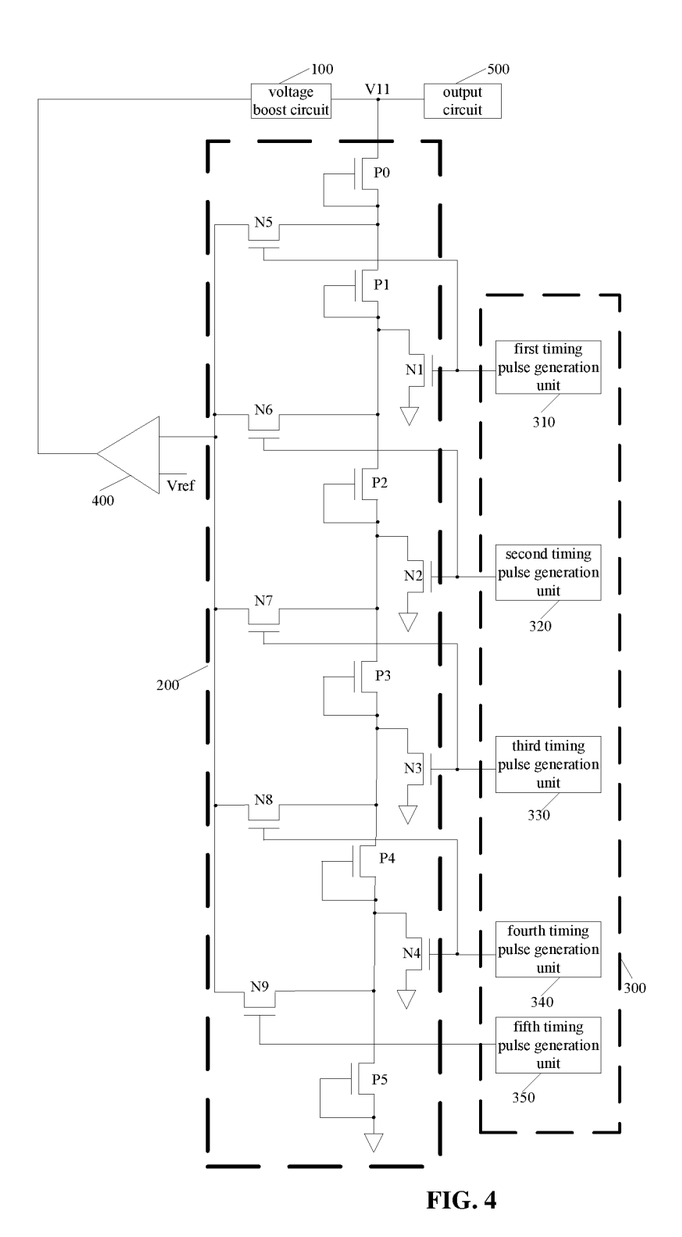
FIG. 4 schematically illustrates a structure diagram of a circuit for controlling operation voltage according to one embodiment of the present disclosure.

Referring to FIG. 4, an example of the circuit for controlling operation voltage is illustrated according to one embodiment of the present disclosure. In the exemplary circuit, m=5, n=4, the type-one switches are NMOS transistors, the type-two switches are NMOS transistors, the receiving transistor and the transistors connected in series of the transistor group are PMOS transistors. In this embodiment, the voltage division circuit 200 may include:

a receiving transistor P0, where a source of the receiving transistor P0 is connected with the output terminal of the voltage boost circuit 100 for receiving the boosted voltage V11, and a gate and a drain of the receiving transistor P0 are connected;

a transistor group including five transistors connected in series, which includes a first transistor P1, a second transistor P2, a third transistor P3, a fourth transistor P4 and a fifth transistor P5, where a source of the first transistor P1 is connected with the drain and the gate of the receiving transistor P0; a gate and a drain of the first transistor P1, and a source of the second transistor P2 are connected together; a gate and a drain of the second transistor P2, and a source of the third transistor P3 are connected together; a gate and a drain of the third transistor P3, and a source of the fourth transistor P4 are connected together; a gate and a drain of the fourth transistor P4, and a source of the fifth transistor P5 are connected together; and a gate and a drain of the fifth transistor P5 is connected with ground;

four type-one switches including: a first type-one switch N1, a second type-one switch N2, a third type-one switch N3 and a fourth type-one switch N4, where a source of the first type-one switch N1 is connected with the drain of the first transistor P1; a source of the second type-one switch N2 is connected with the drain of the second transistor P2; a source of the third type-one switch N3 is connected with the drain of the third transistor P3; a source of the fourth type-one switch N4 is connected with the drain of the fourth transistor P4, all gates of the four type-one switches are connected with the control circuit 300, and all drains of the four type-one switches are connected with ground; and five type-two transistors including a first type-two switch N5, a second type-two switch N6, a third type-two switch N7,
a fourth type-two switch N8 and a fifth type-two switch N9, where a source of the first type-two switch N5 is connected with the source of the first transistor P1; a source of the second type-two switch N6 is connected with the source of the second transistor P2; a source of the third type-two switch N7 is connected with the source of the third transistor P3; a source of the fourth type-two switch N8 is connected with the source of the fourth transistor P4; a source of the fifth type-two switch N9 is connected with the source of the fifth transistor P5; all gates of the five type-two switches are connected with the control circuit 300; and all drains of the five type-two switches are connected with an input terminal of the comparator 400.

The control circuit 300 may include five timing pulse generation units including: a first timing pulse generation unit 310 which is connected with the gate of the first type-one switch N1 and the gate of the first type-two switch N5, and is adapted for generating a first timing pulse signal to control the first type-one switch N1 and the first type-two switch N5 to be turned on or off; a second timing pulse generation unit 320 which is connected with the gate of the second type-one switch N2 and the gate of the second type-two switch N6, and is adapted for generating a second timing pulse signal to control the second type-one switch N2 and the second type-two switch N6 to be turned on or off; a third timing pulse generation unit 330 which is connected with the gate of the third type-one switch N3 and the gate of the third type-two switch N7, and is adapted for generating a third timing pulse signal to control the third type-one switch N3 and the third type-two switch N7 to be turned on or off; a fourth timing pulse generation unit 340 which is connected with the gate of the fourth type-one switch N4 and the gate of the fourth type-two switch N8, and is adapted for generating a fourth timing pulse signal to control the fourth type-one switch N4 and the fourth type-two switch N8 to be turned on or off; and a fifth timing pulse generation unit 350 which is connected with the gate of the fifth type-two switch N9, and is adapted for generating a fifth timing pulse signal to control the fifth type-two switch N9 to be turned on or off.

Specifically, when the first timing pulse signal is a high level signal, the first type-one switch N1 and the first type-two switch N5 are turned on, and when the first timing pulse signal is a low level signal, the first type-one switch N1 and the first type-two switch N5 are turned off; when the second timing pulse signal is a high level signal, the second type-one switch N2 and the second type-two switch N6 are turned on, and when the second timing pulse signal is a low level signal, the second type-one switch N2 and the second type-two switch N6 are turned off; when the third timing pulse signal is a high level signal, the third type-one switch N3 and the third type-two switch N7 are turned on, and when the third timing pulse signal is a low level signal, the third type-one switch N3 and the third type-two switch N7 are turned off; when the fourth timing pulse signal is a high level signal, the fourth type-one switch N4 and the fourth type-two switch N8 are turned on, and when the fourth timing pulse signal is a low level signal, the fourth type-one switch N4 and the fourth type-two switch N8 are turned off; when the fifth timing pulse signal is a high level signal, the fifth type-two switch N9 are turned on, and when the fifth timing pulse signal is a low level signal, the fifth type-two switch N9 is turned off.

It should be noted that, in other embodiments of the present disclosure, by changing device types of the four type-one switches and the five type-two switches, following operations can be achieved: when a timing pulse signal is a low level signal, a corresponding type-one switch and a corresponding type-two switch are turned on; and when the timing pulse signal is a high level signal, the corresponding type-one switch and the corresponding type-two switch are turned off. However, the present disclosure is not limited thereto.

It also should be noted that, in order to save chip area and simplify circuit structure in this embodiment, each of the four former ones of the five timing pulse generation units controls one type-one switch and one type-two switch (namely, control two switches at a same time). However, in other embodiments of the present disclosure, more timing pulse generation units may be added in the circuit, such that at least one timing pulse generation unit only controls one switch to be turned on or off. The above variation doesn't depart from the spirit and scope of the present disclosure.

The voltage division circuit 200 shown in FIG. 4 includes five voltage division coefficients, such that it can output five different divided voltages. Namely, when the boosted voltage V11 is constant, the voltage division circuit 200 may output a first divided voltage V21=(1/2)V11, a second divided voltage V22=(1/3)V11, a third divided voltage V23=(1/4)V11, a fourth divided voltage V24=(1/5)V11 and a fifth divided voltage V25=(1/6)V11, respectively. Namely, a voltage division coefficient of 1/k is generated, where k is an integer between 2 and m+1.

Figure 5:
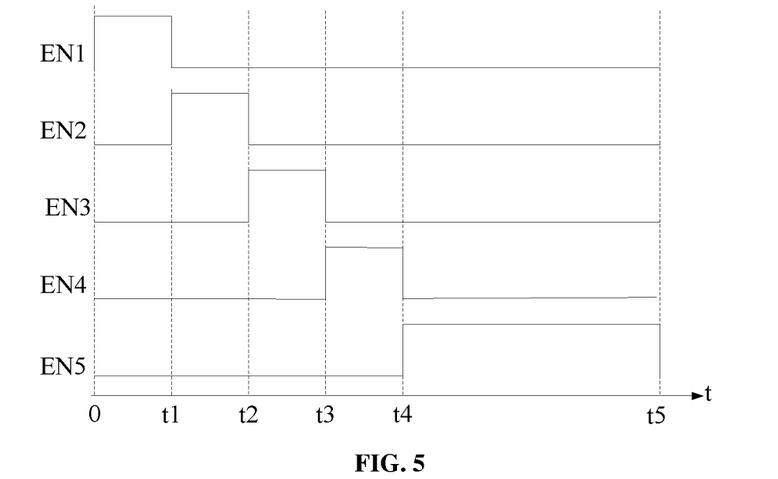
FIG. 5 schematically illustrates a timing diagram of five timing pulse signals according to one embodiment of the present disclosure.

FIG. 5 illustrates a timing diagram of timing pulse signals generated by the five timing pulse generation units shown in FIG. 4. As shown in FIG. 5, the first timing pulse generation unit 310 generates a first timing pulse signal EN1 which is at a high level in a time slot (0, t1) and is at a low level in the rest time; the second timing pulse generation unit 320 generates a second timing pulse signal EN2 which is at a high level in a time slot (t1, t2) and is at a low level in the rest time; the third timing pulse generation unit 330 generates a third timing pulse signal EN3 which is at a high level in a time slot (t2, t3) and is at a low level in the rest time; the fourth timing pulse generation unit 340 generates a fourth timing pulse signal EN4 which is at a high level in a time slot (t3, t4) and is at a low level in the rest time; and the fifth timing pulse generation unit 350 generates a fifth timing pulse signal EN5 which is at a high level in a time slot (t4, t5) and is at a low level in the rest time.

Referring to FIG. 4 and FIG. 5, when the reference voltage Vref is 1V and the target voltage is 6V, a working process of the control circuit will be described in detail hereunder.

1) In the time slot of (0, t1), the first timing pulse signal EN1 is at the high level, such that the first type-one switch N1 and the first type-two switch N5 are turned on. At the same time, the rest four timing pulse signals are at the low level, such that the rest three type-one switches N2, N3 and N4 and the rest four type-two switches N6, N7, N8 and N9, which are connecting to the rest four timing pulse signals, are turned off. Therefore, the voltage division circuit 200 outputs the first divided voltage V21. That is, the voltage division coefficient of the voltage division circuit 200 is 1/2. In other words, by controlling the timing pulse signals generated by the timing pulse generation circuits, the control circuit 300 can control corresponding NMOS transistors to be turned on or off, so as to achieve a purpose of selecting a voltage division coefficient of the voltage division circuit 200. Because the reference voltage Vref is 1V and the voltage division coefficient is 1/2, when the first divided voltage V21 is lower than the reference voltage Vref (at this time, the boosted voltage V11 is lower than 2V), the comparator 400 outputs a high level signal, such that the voltage boost circuit 100 performs the voltage boost process continuously and boosts the boosted voltage V11 to a higher level; and at the moment the boosted voltage V11 is boosted to be higher than 2V, the first divided voltage V21 is higher than the reference voltage Vref, such that the comparator 400 outputs a low level signal, and then the voltage boost circuit 100 stops the voltage boost process and the boosted voltage V11 is maintained at 2V.

It should be noted that, the time slot (0, t1) is longer than a time slot for boosting the boosted voltage V11 to 1.2V.

At the moment, because the first type-one switch N1 is turned on, the voltage division circuit 200 can work properly as long as the boosted voltage V11 is greater than a sum of a threshold voltage of the receiving transistor P0 and a threshold voltage of the first transistor P1.

2) At the time of t1, the first timing pulse signal EN1 is switched to the low level, such that the first type-one switch N1 and the first type-two switch N5 are turned off; the second timing pulse signal EN2 is switched to the high level, such that the second type-one switch N2 and the second type-two switch N6 are turned on; and the rest three timing pulse signals are unchanged, such that the rest switches are still being turned off. Therefore, the voltage division circuit 200 outputs the second divided voltage V22. That is, the voltage division coefficient of the voltage division circuit 200 is 1/3. In other words, by controlling the timing pulse signals generated by the timing pulse generation circuit, the control circuit 300 can control the corresponding NMOS transistors to be turned on or off, so as to achieve a purpose of switching the voltage division coefficient from 1/2 to 1/3. Because the voltage division coefficient is 1/3 and the boosted voltage is 2V, the second divided voltage V22 is 2/3V at the moment. That is, the present divided voltage is lower than the reference voltage Vref. Therefore, the comparator 400 outputs the high level signal again, and then the voltage boost unit 100 continues to perform the voltage boost process, so as to boost the boosted voltage V11 to a higher level on the basis of 2 V.

At the moment, because the second type-one switch N2 is turned on, the voltage division circuit 200 can work properly as long as the boosted voltage V11 is greater than a sum of the threshold voltage of the receiving transistor P0, the threshold voltage of the first transistor P1, and a threshold voltage of the second transistor P2.

3) In the time slot of (t1, t2), all the timing pulse signals are unchanged, thus the voltage boost circuit 100 continuously performs the voltage boost process until the second divided voltage V22 reaches 1V. Namely, the boosted voltage reaches 3V. When the boosted voltage is greater than 3V, the second divided voltage V22 is greater than 1V, such that the comparator 400 changes to output the low level signal, and then the voltage boost circuit 100 stops the voltage boost process and the boosted voltage V111 is maintained at 3V.

It should be noted that, the time slot of (t2-t1) is longer than a time slot for boosting the boosted voltage V11 from 2V to 3V.

4) At the time of t2, the second timing pulse signal EN2 is switched to the low level, such that the second type-one switch N2 and the second type-two switch N6 are turned off; the third timing pulse signal EN3 is switched to the high level, such that the third type-one switch N3 and the third type-two switch N7 are turned on; and the rest three timing pulse signals are unchanged, such that the rest switches are still being turned off. Therefore, the voltage division circuit 200 outputs the third divided voltage V23. That is, the voltage division coefficient of the voltage division circuit 200 is 1/4. In other words, by controlling the timing pulse signals generated by the timing pulse generation circuits, the control circuit 300 can control the corresponding NMOS transistors to be turned on or off, so as to achieve a purpose of switching the voltage division coefficient from 1/3 to 1/4. Because the voltage division coefficient is 1/4 and the boosted voltage is 3V, the third divided voltage V23 is 3/4V at the moment. That is, the present divided voltage is lower than the reference voltage Vref. Therefore, the comparator 400 outputs the high level signal again, and then the voltage boost circuit 100 continues to perform the voltage boost process, so as to boost the boosted voltage V11 to a higher level on the basis of 3 V.

At the moment, because the third type-one switch N3 is turned on, the voltage division circuit 200 can work properly as long as the boosted voltage V11 is greater than a sum of the threshold voltage of the receiving transistor P0, the threshold voltage of the first transistor P1, the threshold voltage of the second transistor P2 and a threshold voltage of the third transistor P3.

5) In the time slot of (t2, t3), all the timing pulse signals are unchanged, thus the voltage boost circuit 100 continuously performs the voltage boost process until the third divided voltage V23 reaches 1V. Namely, the boosted voltage reaches 4V. When the boosted voltage is greater than 4V, the third divided voltage V23 is greater than 1V, such that the comparator 400 changes to output the low level signal, and then the voltage boost circuit 100 stops the voltage boost process and the boosted voltage V11 is maintained at 4V.

It should be noted that, the time slot of (t3-t2) is longer than a time slot for boosting the boosted voltage V11 from 3V to 4V.

6) At the time of t3, the third timing pulse signal EN3 is switched to the low level, such that the third type-one switch N3 and the third type-two switch N7 are turned off; the fourth timing pulse signal EN4 is switched to the high level, such that the fourth type-one switch N4 and the fourth type-two switch N8 are turned on; and the rest three timing pulse signals are unchanged, such that the rest switches are still being turned off. Therefore, the voltage division circuit 200 outputs the fourth divided voltage V24. That is, the voltage division coefficient of the voltage division circuit 200 is 1/5. In other words, by controlling the timing pulse signals generated by the timing pulse generation circuits, the control circuit 300 can control corresponding switches to be turned on or off, so as to achieve a purpose of switching the voltage division coefficient from 1/4 to 1/5. Because the voltage division coefficient is 1/5 and the boosted voltage is 4V, the fourth divided voltage V24 is 4/5V at the moment. That is, the present divided voltage is lower than the reference voltage Vref. Therefore, the comparator 400 outputs the high level signal again, and then the voltage boost circuit 100 continues to perform the voltage boost process, so as to boost the boosted voltage V11 to a higher level on the basis of 4 V.

At the moment, because the fourth type-one switch N4 is turned on, the voltage division circuit 200 can work properly as long as the boosted voltage V11 is greater than a sum of the threshold voltage of the receiving transistor P0, the threshold voltage of the first transistor P1, the threshold voltage of the second transistor P2, the threshold voltage of the third transistor P3 and a threshold voltage of the fourth transistor P4.

7) In the time slot of (t3, t4), all the timing pulse signals are unchanged, thus the voltage boost circuit 100 continuously performs the voltage boost process until the fourth divided voltage V24 reaches 1V. Namely, the boosted voltage reaches 5V. When the boosted voltage is greater than 5V, the fourth divided voltage V24 is greater than 1V, such that the comparator 400 changes to output the low level signal, and then the voltage boost circuit 100 stops the voltage boost process and the boosted voltage V11 is maintained at 5V.

It should be noted that, the time slot of (t4-t3) is longer than a time slot for boosting the boosted voltage V11 from 4V to 5V.

8) At the time of t4, the fourth timing pulse signal EN4 is switched to the low level, such that the fourth type-one switch N4 and the fourth type-two switch N8 are turned off; the fifth timing pulse signal EN5 is switched to the high level, such that the fifth type-two switch N9 are turned on; and the rest three timing pulse signals are unchanged, such that the rest switches are still being turned off. Therefore, the voltage division circuit 200 outputs the fifth divided voltage V25. That is, the voltage division coefficient of the voltage division circuit 200 is 1/6. In other words, by controlling the timing pulse signals generated by the timing pulse generation circuits, the control circuit 300 can control corresponding switches to be turned on or off, so as to achieve a purpose of switching the voltage division coefficient from 1/5 to 1/6. Because the voltage division coefficient is 1/6 and the boosted voltage is 5V, the fifth divided voltage V25 is 5/6V at the moment. That is, the present divided voltage is lower than the reference voltage Vref. Therefore, the comparator 400 outputs the high level signal again, and then the voltage boost circuit 100 continues to perform the voltage boost process, so as to boost the boosted voltage V11 to a higher level on the basis of 5 V.

9) In the time slot of (t4, t5), all the timing pulse signals are unchanged, thus the voltage boost circuit 100 continuously performs the voltage boost process until the fifth divided voltage V25 reaches 1V. Namely, the boosted voltage reaches 6V. When the boosted voltage is greater than 6V, the fifth divided voltage V25 is greater than 1V, such that the comparator 400 is changed to output the low level signal, and then the voltage boost circuit 100 stops the voltage boost process and the boosted voltage V11 is maintained at 6V.

It should be noted that, the time slot of (t5-t4) is longer than a time slot for boosting the boosted voltage V11 from 5V to 6V, and is determined by duration of the erase voltage. It should be noted that, the above durations of the boosted voltages in different time slots may have a same length, or parts of them may have a same length, or none of them has a same length.

Figure 6:
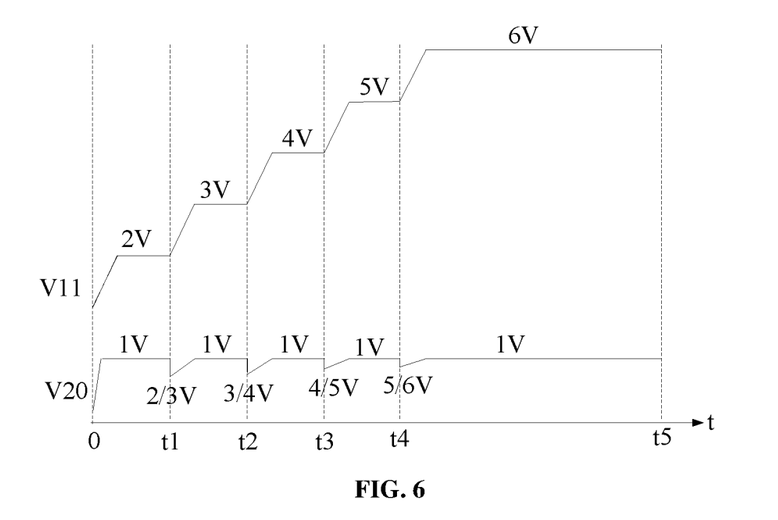
FIG. 6 schematically illustrates a timing diagram of a boosted voltage and a divided voltage according to one embodiment of the present disclosure.

From above, a diagram illustrating a relationship of the boosted voltage V11 with time, and a relationship of the divided voltage V20 with time is shown in FIG. 6. As the output voltage of the output circuit 500 is the boosted voltage V11, a relationship of the operation voltage with time is the same as the relationship of the boosted voltage V11 with time shown in FIG. 6.

In this embodiment, because transistors are used to perform the voltage division process, chip area for forming the circuit is saved. Further, because additional switches are added in the circuit, the voltage division circuit can work properly under a condition that the voltage to be divided is low.

In this embodiment, the voltage divide circuit corresponds to five voltage division coefficients. The control circuit performs descending switching operation on the all voltage division coefficients; namely, the voltage division coefficients are switched from big to small, thus the boost process of the boosted voltage can be divided into five stages. Each stage includes two processes of boosting and maintaining, such that a process for the boosted voltage reaching the target voltage is slowed down, and damage to the storage unit is avoided. At the same time, the output voltage of the voltage boost circuit is used as the target voltage, such that there is no difference between them, and a negative effect on device power and performance, which is caused by threshold voltage variations in the working process, is eliminated.

It should be noted that, in other embodiments of the present disclosure, the switching control process is performed on only parts of the voltage division coefficients by changing timing pulse signals provided by the control circuit (namely, parts of the timing pulse signals are always a low level signal), so as to reduce a number of establishing stages of the operation voltage.

It should be noted that, in other embodiments of the present disclosure, a number of the type-one switches is less than a difference between a number of the transistors connected in series and 1; and a number of the type-two switches is less than the number of the transistors connected in series. However, the present disclosure is not limited thereto.

It also should be noted that, in other embodiments of the present disclosure, a number of the output terminals may be less than a number of the switches. However, the present disclosure is not limited thereto.

Correspondingly, a storage device is also provided in embodiments of the present disclosure. The storage device includes the above circuit for controlling operation voltage, so as to provide an erase voltage and other operation voltages.

Correspondingly, a voltage division circuit is also provided in embodiments of the present disclosure. The voltage division circuit may include:

a receiving transistor, where a source of the receiving transistor is adapted for receiving a voltage to be divided;

a transistor group including m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground;

n type-one switches, each of which includes a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or off, and n≤m−1; and n+1 type-two switches, each of which includes a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting a divided voltage, and the third terminal is adapted for receiving the timing control signal so as to control the type-two switch to be turned on or off.

wherein the type-one switches may be NMOS transistors; and for each of type-one switches, the first terminal is a source, the second terminal is a drain and the third terminal is a gate;

wherein the type-two switches may be NMOS transistors; and for each of the type-two switches, the first terminal is a source, the second terminal is a drain and the third terminal is a gate; and wherein the transistors of the transistor group are PMOS transistors.

A working process of the voltage division circuit is mentioned in above embodiments, and is not described in detail herein.

It should be noted that, the voltage division circuit not only can be used in the above circuit for controlling operation voltage, but also can be used in other apparatuses which need to perform multiple voltage division operations on signals to be divided and the voltage division coefficients of which are 1/2, 1/3 ... 1/(n+1).

The voltage division circuit of the present disclosure can save chip area, and can work properly under a condition that the voltage to be divided is low.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A voltage division circuit, comprising:
   a receiving transistor, where a source of the receiving transistor is adapted for receiving a voltage to be divided;
   a transistor group comprising m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground;
   n type-one switches, each of which comprises a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or off, and n≤m−1; and
   n+1 type-two switches, each of which comprises a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting a divided voltage, and the third terminal is adapted for receiving the timing control signal so as to control the type-two switch to be turned on or off.

2. The voltage division circuit according to claim 1, wherein the transistors of the transistor group are PMOS transistors.

3. The voltage division circuit according to claim 1, wherein the type-one switches are NMOS transistors; and for each of type-one switches, the first terminal is a source, the second terminal is a drain and the third terminal is a gate; and
   wherein the type-two switches are NMOS transistors; and for each of the type-two switches, the first terminal is a source, the second terminal is a drain and the third terminal is a gate.

4. A circuit for controlling operation voltage, comprising:
   a voltage boost circuit adapted for: if receiving a first signal, performing a voltage boost process so as to output a boosted voltage; and if receiving a second signal, stopping the voltage boost process and maintaining a value of the boosted voltage;
   a voltage division circuit adapted for performing a voltage division process on the boosted voltage so as to output a divided voltage, wherein the voltage division circuit comprises a plurality of different voltage division coefficients, and wherein the voltage division circuit comprises: a receiving transistor, where a source of the receiving transistor is adapted for receiving the boosted voltage; a transistor group comprising m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground; n type-one switches, each of which comprises a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or off, and n≤m−1; and n+1 type-two switches, each of which comprises a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting the divided voltage, and the third terminal is adapted for receiving the timing control signal so as to control the type-two switch to be turned on or off;

a comparator adapted for: comparing the divided voltage with a reference voltage; if the divided voltage is lower than the reference voltage, outputting the first signal; and if the divided voltage is higher than the reference voltage, outputting the second signal;

a control circuit adapted for generating a timing control signal, so as to perform a descending switching operation on at least parts of the plurality of voltage division coefficients until the boosted voltage reaches a target voltage; and an output circuit adapted for outputting the boosted voltage.

5. The circuit for controlling operation voltage according to claim 4, wherein the transistors of the transistor group are PMOS transistors.

6. The circuit for controlling operation voltage according to claim 4, wherein the type-one switches are NMOS transistors; and for each of type-one switches, the first terminal is a source, the second terminal is a drain and the third terminal is a gate; and wherein the type-two switches are NMOS transistors; and for each of the type-two switches, the first terminal is a source, the second terminal is a drain and the third terminal is a gate.

7. The circuit for controlling operation voltage according to claim 4, wherein the control circuit comprises n+1 timing pulse generation units, where each of n former ones of the n+1 timing pulse generation units is connected with one type-one switch and one type-two switch, and is adapted for generating a timing pulse signal to control the type-one switch and the type-two switch to be turned on or off; and the last one of the n+1 timing pulse generation units is connected with one type-two switch, and is adapted for generating a timing pulse signal to control the type-two switch to be turned on or off.

8. The circuit for controlling operation voltage according to claim 7, wherein the timing pulse generation unit comprises a decoding circuit and a NOR gate, the decoding circuit is connected with a first input terminal of the NOR gate, a second input terminal of the NOR gate is adapted for receiving a low level signal, and an output terminal of the NOR gate is connected with the type-one switch and the type-two switch.

9. The circuit for controlling operation voltage according to claim 4, wherein the first signal is a high level signal, and the second signal is a low level signal.

10. A storage device, comprising: a circuit for controlling operation voltage, wherein the circuit for controlling operation voltage comprises:

a voltage boost circuit adapted for: if receiving a first signal, performing a voltage boost process so as to output a boosted voltage; and if receiving a second signal, stopping the voltage boost process and maintaining a value of the boosted voltage;

a voltage division circuit adapted for performing a voltage division process on the boosted voltage so as to output a divided voltage, wherein the voltage division circuit comprises a plurality of different voltage division coefficients, and wherein the voltage division circuit comprises: a receiving transistor, where a source of the receiving transistor is adapted for receiving the boosted voltage; a transistor group comprising m transistors which are connected in series, where a gate and a drain of a former one of every two adjacent transistors are connected with a source of a latter one; a source of a first transistor of the transistor group, a gate and a drain of the receiving transistor are connected together; and a drain and a gate of a last transistor of the transistor group are connected with ground; n type-one switches, each of which comprises a first terminal, a second terminal and a third terminal, where the first terminal is connected with a drain of a former one and a source of a latter one of two adjacent transistors in the transistor group, the second terminal is connected with ground, the third terminal is adapted for receiving a timing control signal so as to control the type-one switch to be turned on or off, and n≤m−1; and n+1 type-two switches, each of which comprises a first terminal, a second terminal and a third terminal, where the n+1 type-two switches are corresponding to n+1 transistors of the transistor group respectively, the first terminal is connected with a source of a corresponding transistor in the transistor group, the second terminal is adapted for outputting the divided voltage, and the third terminal is adapted for receiving the timing control signal so as to control the type-two switch to be turned on or off;

a comparator adapted for: comparing the divided voltage with a reference voltage; if the divided voltage is lower than the reference voltage, outputting the first signal; and if the divided voltage is higher than the reference voltage, outputting the second signal;

a control circuit adapted for generating a timing control signal, so as to perform a descending switching operation on at least parts of the plurality of voltage division coefficients until the boosted voltage reaches a target voltage; and an output circuit adapted for outputting the boosted voltage.

11. The storage device according to claim 10, wherein the transistors of the transistor group are PMOS transistors.

12. The storage device according to claim 10, wherein the type-one switches are NMOS transistors; and for each of type-one switches, the first terminal is a source, the second terminal is a drain and the third terminal is a gate; and wherein the type-two switches are NMOS transistors; and for each of the type-two switches, the first terminal is a source, the second terminal is a drain and the third terminal is a gate.

13. The storage device according to claim 10, wherein the control circuit comprises n+1 timing pulse generation units, where each of n former ones of the n+1 timing pulse generation units is connected with one type-one switch and one type-two switch, and is adapted for generating a timing pulse signal to control the type-one switch and the type-two switch to be turned on or off; and the last one of the n+1 timing pulse generation units is connected with one type-two switch, and is adapted for generating a timing pulse signal to control the type-two switch to be turned on or off.

14. The storage device according to claim 13, wherein the timing pulse generation unit comprises a decoding circuit and a NOR gate, the decoding circuit is connected with a first input terminal of the NOR gate, a second input terminal of the NOR gate is adapted for receiving a low level signal, and an output terminal of the NOR gate is connected with the type-one switch and the type-two switch.

15. The storage device according to claim 10, wherein the first signal is a high level signal, and the second signal is a low level signal.

* * * * *